United States Patent [19]

Gold

[11] 4,047,204
[45] Sept. 6, 1977

[54] VARIABLE INTERLACE DISPLAY

[75] Inventor: James J. Gold, Mountain View, Calif.

[73] Assignee: American Optical Corporation, Southbridge, Mass.

[21] Appl. No.: 720,912

[22] Filed: Sept. 7, 1976

Related U.S. Application Data

[63] Continuation of Ser. No. 534,975, Dec. 20, 1974, abandoned.

[51] Int. Cl.² .............................................. H04N 3/16
[52] U.S. Cl. ........................................ 358/93; 358/242
[58] Field of Search .......................... 358/93, 242, 150

[56] References Cited

U.S. PATENT DOCUMENTS

| | | | |
|---|---|---|---|
| 3,006,995 | 10/1961 | Fathauer | 178/69.5 C |
| 3,116,436 | 12/1963 | Sweeney | 178/7.1 |
| 3,281,532 | 10/1966 | Leeds | 178/69.5 C |

*Primary Examiner*—Robert L. Griffin
*Assistant Examiner*—Michael A. Masinick
*Attorney, Agent, or Firm*—H. R. Berkenstock, Jr.; William C. Nealon

[57] ABSTRACT

Apparatus for utilization in driving a raster-type display, such as is used in the familiar television system for producing a selectable (according to a predetermined group) of raster formats of different raster interlace rates.

3 Claims, 2 Drawing Figures

VARIABLE INTERLACE DISPLAY

This is a continuation of application Ser. No. 534,975 filed Dec. 20, 1974, now abandoned.

BACKGROUND OF THE INVENTION

The present invention relates specifically to the display of the image of a scanning electron microscope system. The invention provides among its objectives, an improvement of resolution available upon a TV-like display of the specimen image painted upon a cathode ray tube.

Much of the theoretical and experimental work with scanning electron microscopes was undertaken in the 1930's. This body of instrumentation utilized a thermionic source for electrons (heated filament) which produced an electron beam which was focused and accelerated and further caused to illuminate a specimen. One of the inherent characteristics of the thermionic systems is a low current beam which when used in the high magnification ranges for which electron microscopy is particularly useful, required repeated scans and recording of an image upon photographic film. This was due to the insufficiency of beam current and existent technology to provide a suitable signal/detector link to provide "real time" viewing as by a TV-type screen.

The advent in the late 1960's of field emission sources in electron microscopy provided a beam brightness which found an immediate adaptability to TV-type television image signal processing. As field emission microscopy developed into a commercial reality, a need developed within that industry for dynamic, flicker-free TV viewing, high resolution and stereoscopic TV systems.

The normal television system in the United States is based on a 525 line scanning system having a two-to-one interlace ratio. This means that two fields of 262½ lines are placed on the screen, the second field of lines being interposed between the lines of the first. While 525 lines have been found quite adequate for normal viewing of TV, at the distances usually encountered, the photographing of such screens and the images thereon renders such systems unsatisfactory. It has been found that the enlargement of the photographic images produced by scanning electron microscopes reveals the spaces between successive scans and thus generates lined photographs.

A logical improvement to the elimination of such lines would be to increase the number of scanning lines placed upon the face of the tube. However, such an improvement is not without substantial drawbacks. Those skilled in TV systems will immediately recognize the higher numbers of lines enormously expands the required bandwidth of the broadcast (and display) system and thus significantly increases costs and complexity.

It will be further recognized by those skilled in the art that bandwidth requirements can be reduced by a technique of alternative line scanning called interlacing. This philosophy is well known in the art and described in several references, such as Millman and Taub's "Pulse and Digital Circuits" McGraw Hill, 1956 pp. 515-517. The domestic TV industry by way of example, uses a 2:1 interlace, as mentioned above. Extensions of the philosophy beyond this basic 2:1 interlace system are not without substantial problems, however. Many of these are elaborated upon in U.S. Pat. No. 3,767,926 (RE 28,153), issued to Vincent J. Coates and Leonard M. Welter and commonly assigned to American Optical Corporation, the assignee of the present application. The display system disclosed therein is directed to overcoming the problems of extended interlace. The invention provided a system with an interlace of greater than 2 to 1 and included nonsequential interlacing to avoid a cascade or waterfall effect which was discovered and identified in the development of that invention.

The present invention provides, among its objects high numbered interlace patterns to improve the resolution available for line-free photomicrographs in scanning electron microscopy. The invention also provides a changeability of interlace among certain preselected patterns, to adapt the interlace pattern to the needs of the photomicrograph and the anticipated enlargement thereof.

It should be understood, however, that the application of the invention is not restricted to the field of scanning electron microscopy. TV (cathode ray tube) displays are in common usage in a variety of information systems, and the present invention may be adapted to use therein wherever a need for multiple interlace is advantageous.

SUMMARY OF THE INVENTION

Apparatus for utilization in driving a raster-type display, such as is used in the familiar system for producing a selectable (according to a predetermined group) of raster formats of different raster interlace rates.

In accordance with certain features of the invention means are provided forming a phase lock loop oscillator circuit producing a multiple of the line or system input frequency. Subsequent means provides for division of the oscillator frequency according to a multiple of the highest order of interlace, for driving the horizontal output. Vertical output driving means are provided by means including a variable control which provides a divide ratio of the oscillator frequency for the vertical output and acting as an input to the phase lock loop to provide the desired interlace multiple.

DESCRIPTION OF A PREFERRED EMBODIMENT

The present invention will be described in reference to U.S. Pat. No. 3,767,926 (RE 28,153) wherein a TV type display for a scanning electron microscope. It should be recognized that the present invention can be utilized in any apparatus having a CRT which is scanned in a raster pattern and information is written on the tube by modulation of the CRT beam intensity.

Figure 1:
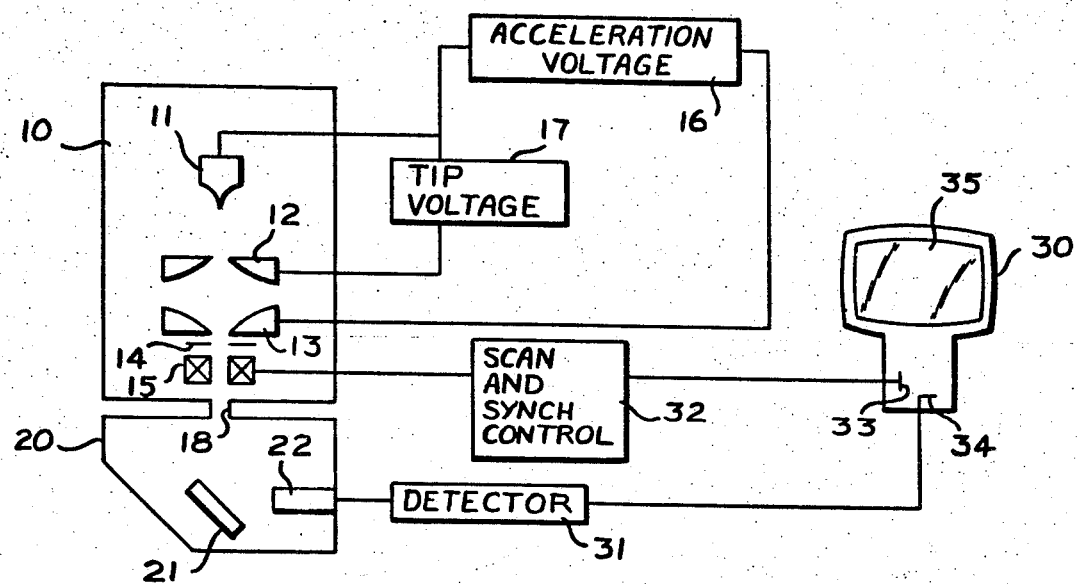
FIG. 1 is a schematic diagram showing the display components of a scanning electron microscope which may embody the invention.

Referring now to FIG. 1, there is illustrated a field emission electron gun 10 interconnected to a specimen chamber 20. Those electrical potentials necessary for operating the illustrative electron gun are supplied by tip voltage source 17 and focus and acceleration voltage source 16. Scan and Sync Control 32, detector 31 and CRT type viewing monitor 30 complete the remaining portion of the display system.

Field emission gun 10 is typical of those presently found in the art and for additional understanding, reference may be had to U.S. Pat. Nos. 3,678,333, 3,766,42 and 3,784,815, all commonly assigned to the assignee of the present invention. In the illustrated embodiment a field emission tip 11, which is a suitably shaped cathode of appropriate metal, and described in the art, produces the beam of charged particles when placed in a sufficiently high electric field. Tip voltage source 17 interconnected between tip 11 and a first anode 12 supplies the necessary field for the production of charged particles (electrons). The focusing and accelerating voltage source 16 interconnected between tip 11 and second anode 13 provides the necessary electrical field in conjunction with anode 12 to focus the particles to a desired beam size.

Since it is a scanning type device to which our attention is drawn, it is necessary that the charged particle beam be deflected in a predetermined pattern in order to appropriately scan the specimen undergoing investigation. Deflection coils 15 are driven by the Scan and Sync control unit 32 to deflect the beam in the appropriate manner. In this system, the beam is scanned horizontally across the specimen, then rapidly returned to a starting point vertically displaced from the initial, and subsequent lines are then scanned in a similar manner. As the horizontal beam is swept across the specimen, it is continuously vertically displaced, thusly eventually covering the entire specimen surface. This type of scanning pattern is well known to those in the miscroscopy art and is entirely similar to that normally used in the transmission of television pictures.

The beam, after deflection, is passed through an interconnecting orifice 18 between gun 10 and specimen chamber 20. The specimen 21 is located in the physical path of the electron beam and is scanned in the manner heretofore described. Impingement of the beam upon the specimen 21 produces the emission of secondary particles, in the specific instance of this embodiment, secondary electrons, as well as reflected electrons which may be detected by unit 22. The sensing device 22 is of the scintillation type well known to those ordinarily skilled in the art and converts the signals derived from the specimen 21 to an amplified electrical signal upon which detector unit 31 may further operate. The sensing unit 22, in addition to the scintillator detector, normally includes a photomultiplier or other similar element. The detector 31 further amplifies the signal and appropriately modifies it for operation with a viewing tube of the normal TV monitoring type. This detector means of the display system may then be thought of as incorporating sensing unit 22 as well as detector 31.

In the usual viewing tube 30, a viewing face 35 is provided having a sensitized surface which emits light upon the impingement of an electron beam. Normally, the sensitized surface is coated with a phosphor or other suitable material. The beam of the viewing tube is generated from a thermionic type cathode and deflected by electrostatic plates typically shown as 33 of viewing tube 30. If the image formed on the face of viewing tube 30 is to have coherency with the signals derived from the specimen 21, it is essential that a fixed and known relationship in both time and phase be maintained between the field emission gun 10, electron beam, and the electron beam of viewing tube 30. Normally, it is found suitable to have both beams in exact synchronism with the signal produced by detector 31, thus producing a real time image of the specimen being investigated. As previously alluded to, advantage may be taken of viewing tube 30 face persistency as well as the persistency of the eye in limiting the bandwidth requirements of a viewing system.

Figure 2:
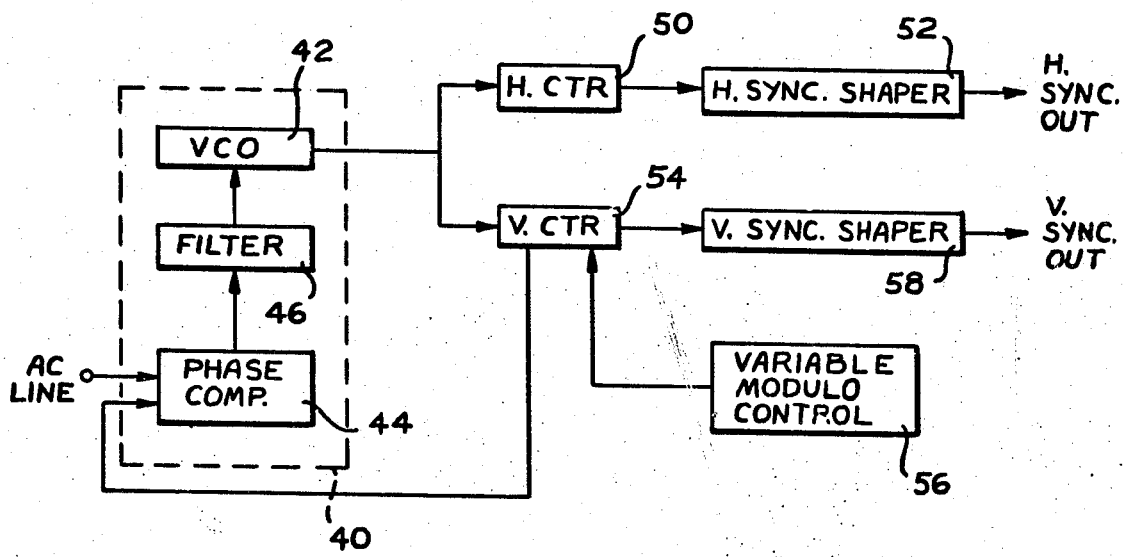
FIG. 2 is a schematic diagram illustrating a preferred embodiment of the invention.

A complete vertical and horizontal sweep of the surface of a specimen is known as a field. If the field contains all of the horizontal scanning lines necessary to achieve system resolution, then the term "field" and "frame" are equivalent within a given system. However, in those instances where interlacing is used, i.e., each field contains only a portion of the total number of lines in the pattern, then a number of fields are required to make up or produce a complete frame. In the instance of a two-to-one interlace ratio, there are two fields per frame while in the case of a four-to-one ratio, there are four fields per frame. In this embodiment, a variety of interlace patterns may be selected. The circuit illustrated in FIG. 2 provides interlaces of 1:1, 2:1, 4:1, 8:1, and 16:1, by selection through a control knob. By choosing appropriate oscillator frequencies, multipliers and dividers, any variety of other interlace ratios might be provided.

By way of operation, generally the first field is painted by the tube beam on its sensitized face leaving a space equivalent to the number of lines between each succeeding line of the field. The next subsequent field paints a second line while the remaining fields fill in the remaining blank lines of the pattern, thus after completion of all fields, a complete picture having maximum resolution is obtained on the face of viewing tube 30. The sync signals necessary to keep the scanning lines, both vertical and horizontal of viewing tube 30 and deflection coils 15, in exact phase relationship are incorporated into the output signals of the Scan and Sync control unit 32. The output signal of detector 31 applied to a signal grid 34 of viewing tube 30 modulates the electron beam of the tube and thereby affects the brightness and contrast of the image to produce a recognizable picture of specimen 21.

Reference to FIG. 2 will illustrate the circuit elements for selective interlace. As previously mentioned, the illustrated embodiment illustrates selectable interlace from 1:1 to 16:1 by multiples of 2. Additionally, for stability of the entire system (including synchronizing of gun 10 to display 30, the vertical rate of the scan control is phase locked to the system power line (60 hertz for U.S. operation). As will be seen from the following table, the horizontal rate of 15750 ± 1% hertz was selected (this is standard in U.S. television) for all interlace positions. These requirements are not essential to the selectable interlace system, however, they are desirable in scanning electron microscopy for minimization of AC electromagnetic field distortion by synchronous detection and to enable the use of standard television components.

The variable interlace sync generator 32 includes a phase lock loop 40 having a voltage controlled oscillator (VCO) 42, a phase comparator 44 and a low pass filter 46. The voltage controlled oscillator is connected to a horizontal counter 50 which in the present embodiment for a maximum 16:1 selectable interlace divides the input frequency of the VCO 42 by 32 (preset for the 1:1, 2:1, 4:1, 8:1 and 16:1 patterns desired in this embodiment). Connected to the horizontal counter 50 is a pulse generating and shaping circuit 52 which is triggered by the VCO 42 from the horizontal rate information generated therein. The function, e.g., pulse output of the horizontal pulse generating and shaping circuit 52 is similar to those employed in conventional TV systems. Also connected to voltage Controlled Oscillator 42 is vertical Counter 54 which is a variable modulo digital counter. This counter is controllable through Variable Modulo Control 56. Under the influence of Control 56, Counter 54 provides the necessary frequency output to drive the vertical sync shaper 58. In function, Vertical Counter divides the frequency output of the VCO 42 to provide Vertical sync at 58. The Vertical Counter's 54 output in addition to providing the sync for shaper 58, also inputs to the phase lock control loop 40 to, in effect, set the primary frequency of VCO 42, around which the entire system operates.

In operation, for the 1, 2, 4, 8 and 16:1 interlaces of the illustrated embodiment, Table I illustrates the frequency and line values for the circuit illustrated in FIG. 2.

TABLE I

| Interlace | V Rate | H Rate | Lines per Field | VCO Rate = 32 × H Rate | V.Ctr ÷ |
|---|---|---|---|---|---|
| 1:1 | 60 Hz. | 15720 Hz | 262 | 503040 Hz | 8384 |
| 2:1 | 60 | 15750 | 262-1/2 | 504000 | 8400 |
| 4:1 | 60 | 15735 | 262-1/4 | 503520 | 8392 |
| 8:1 | 60 | 15727.5 | 262-1/8 | 503280 | 8388 |
| 16:1 | 60 | 15723.75 | 262-1/16 | 503160 | 8386 |

NOTE: Lines per Field = (H Rate) ÷ (V Rate).

The VCO 42, Vertical Counter 54, phase comparator 44 and filter 46 form a simple phase lock which phase-locks the output frequency of the VCO 42 at a multiple of the AC line frequency (60 Hz) set by the vertical counter (or 60 × the multiple of the Vertical Counter 54 — which for 1:1 is 60 × 8384 = 503040. Adjustment of the Variable Modulo Control 56 adjusts the multiplier of the Vertical Counter 54. Since (for the 1-16:1 interlace, the Horizontal Counter 50 divides by a constant factor (32) its output gives $$\frac{VCO}{H\,Ctr} = \frac{503040}{32} \div 60\,hz.,$$

or 262 lines per field, or 262 horizontal lines per vertical scan. By examining the interlace selection available for the illustrated system, the frequencies and function of the circuit of FIG. 2 may be appreciated for the other interlace patterns.

By way of example of further embodiments, it may be desirable to choose an interlace of sequential integers such as 1:1, 2:1, 3:1, 4:1, 5:1 ... n:1. For the purposes of illustration, a system for 1:1→5:1 variable interlace will be described.

For such a "5 to 1" system, the voltage controlled oscillator is connected to horizontal counter 50 which divides the input frequency of the VCO by 120. The other previously-named components are utilized in a similar manner, as previously described (such as pulse generating and shaping circuit 52, Vertical Counter 54, Variable Modulo Control 56, etc.) however functioning with the values indicated below in TABLE II. This Table provides the requisite frequency and line values for the 1:1 through 5:1 interlace for the circuit illustrated in FIG. 2.

As in the previous embodiment, the VCO 42, Vertical Counter 54, phase comparator 44, and filter 46 form a simple phase lock loop which phase locks the output frequency of the VCO 42 at a multiple of the AC line frequency (eg. 60 Hz) set by the vertical counter (or 60 × the multiple of the Vertical Counter 54 — which for 1:1 of the 1-5:1 variable system is 60 × 31440 = 1886400). As before, adjustment of the Variable Modulo Control 56 adjusts the multiplier of the Vertical Counter 54. Since (for the 1-5:1 system), the Horizontal Counter 50 divides by a constant factor (120) its output gives $$\left(\frac{VCO}{H\,Ctr} = \frac{1886400}{120}\right) \div 60\,Hz,$$

or 262 lines per field, or 262 horizontal lines per vertical scan. It should be understood that this sequential integer variable system might be extended to any desirable interlace pattern, 1-16:1 and 1-5:1 being convenient for illustration.

From the above examples, it should be apparent that this approach and basic circuitry may be employed for a variety of preselected interlace ratios, by properly selecting base frequencies, and multiples to phase lock to a given line frequency. Further, it may be desirable to phase-lock a specially generated line frequency of other than 60 hz. for peculiar interlace ratios. Likewise, the illustrated variable interlace system may find utility in such non-sequential scanning systems as disclosed in U.S. Pat. Re 28,153 (commonly assigned with the instant application) and to special television systems, as perhaps those offering stereo-viewing.

I claim:

1. In apparatus for varying according to a predetermined selection range the interlace rate of a rastered display, such as on a cathode ray tube including a horizontal deflection control circuit and a vertical deflection control circuit connected respectively to a horizontal drive and a vertical drive, the improvement comprising: variable oscillation means to generate a principal frequency to drive said horizontal and vertical drives, said frequency being a multiple of the horizontal deflection rate and the predetermined interlace rates; horizontal counter means for reducing the oscillation frequency to a frequency equal to the horizontal rate for the predetermined interlace rate; vertical counter means for reducing the oscillation frequency equal to the vertical rate for the predetermined interlace rate; and control

TABLE II

| Interlace | V Rate | H Rate | Lines per Field | VCO Rate = 32 × H Rate | V.Ctr ÷ |
|---|---|---|---|---|---|
| 1:1 | 60 Hz. | 15720 Hz | 262 | 1886400 Hz | 31440 |
| 2:1 | 60 | 15750 | 262 1/2 | 1890000 | 31500 |
| 3:1 | 60 | 15740 | 262 1/3 | 1888800 | 31480 |
| 4:1 | 60 | 15735 | 262 1/4 | 1888200 | 31470 |
| 5:1 | 60 | 15732 | 262 1/5 | 1887840 | 31464 | means for said vertical counter and said oscillation means which cause the quotient of said horizontal rate divided by said vertical rate to be a fractional number, the fractional portion of which represents the desired interlace rate.

2. The improvement according to claim 1 wherein said variable oscillation means is phase-locked to the frequency of the main power supply for said display.

3. The improvement according to claim 1 wherein said horizontal rate for said display is substantially equal to the horizontal rate of commercial television systems.

* * * * *